Jan. 26, 1971 MICHIO OTSUKA ET AL 3,559,006

SEMICONDUCTOR DEVICE WITH AN INCLINED INWARDLY EXTENDING GROOVE

Filed Nov. 14, 1968

MICHIO OTSUKA &

HISAYOSHI MURAMATSU

INVENTORS

BY Flynn & Frishauf

Attorneys

United States Patent Office 3,559,006

Patented Jan. 26, 1971

3,559,006

SEMICONDUCTOR DEVICE WITH AN INCLINED INWARDLY EXTENDING GROOVE

Michio Otsuka, Tokyo, and Hisayoshi Muramatsu, Kawasaki-shi, Japan, assignors to Tokyo Shibaura Electric Co., Ltd., Kawasaki-shi, Japan, a Japanese corporation Filed Nov. 14, 1968, Ser. No. 775,827
Claims priority, application Japan, Apr. 11, 1968, 43/23,680
Int. Cl. H01l *11/10*
U.S. Cl. 317—235 8 Claims

ABSTRACT OF THE DISCLOSURE

A semiconductor device having a high resistivity layer and a low resistivity layer formed on one side of said high resistivity layer, with a PN junction defined therebetween, wherein there is formed a surrounding groove extending from the low resistivity layer to the high resistivity layer in a manner to incline inwardly toward the central axis of the semiconductor apparatus, with the bottom of said groove disposed in the high resistivity layer.

The present invention relates to a semiconductor device whose surface near the PN junction has an elevated breakdown voltage as well as to a method of manufacturing the same.

Semiconductor devices, wherein great importance has heretofore been attached to an inverse blocking voltage at the end of the PN junction, include a slicon controlled rectifier. This type of rectifier consists of a semiconductor element comprising, for example, a PNPN quadruple layer. On the first N-type layer is formed a cathode electrode, on the second layer a gate electrode and on the fourth layer an anode electrode. The third layer sandwiched between the second and fourth layers has high resistivity, while the latter two layers have low resistivity. To obtain an elevated breakdown voltage on the surface around the junction, the peripheral surface of the semiconductor element is generally inclined or beveled in such a manner that the diameter of the element is gradually reduced from the fourth to the first layer. In this case, the peripheral surface of the element including the PN junction between the third and fourth layers assumes the so-called positive bevel form, so that the breakdown voltage on the surface near the peripheral edge of the junction is fully raised. On the other hand, the PN junction between the second and third layers has the so-called negative bevel form, so that the breakdown voltage on the surface near the peripheral edge of the junction can be rendered as large as possible by reducing the angle of inclination to a great extent, say, to less than 6°.

However, where the angle of inclination of the peripheral surface of the semiconductor element relative to the PN junction is reduced, the top surface of the element, namely, the plane, to which is fitted to cathode electrode, will have a small area, even though the element as a whole may be of an appreciably large diameter. This will not permit the cathode electrode to have a large diameter with the result that the current capacity of the semiconductor element will be greatly reduced due to the limited effective areas of the current path. Moreover, even when the angle of inclination of the negative bevel form is reduced to less than 6° as described above, the breakdown voltage on the peripheral surface of said portion is lower than that of the positive bevel section, so that the overall inverse blocking voltage of the entire semiconductor apparatus is eventually determined by the breakdown voltage on the surface of said negative bevel portion. A maximum blocking voltage obtained with a semiconductor apparatus manufactured to date has been 3000 volts at most.

The semiconductor apparatus of the present invention consists of a semiconductor element having a high resistivity layer of one type of conductivity and an adjacent low resistivity layer of the opposite type of conductivity and a surrounding groove so formed as to extend from the PN junction to the high resistivity layer of said element, that area of the high resistivity layer surrounded by the groove being so shaped as to have its diameter gradually reduced toward the bottom of the groove. When a reverse bias voltage is impressed on the PN junction, the width of the depletion layer generated in the high resistivity layer is made broader in the vicinity of the groove than at the central part of the semiconductor element so as to exhibit the effect of the so-called position bevel formation, with the result that there is obtained an elevated breakdown voltage at the end of the PN junction. Further, the provision of said groove affords a larger effective area for the formation of an electrode in the semiconductor element. The method of the present invention permits the easy fabrication of an excellent semiconductor apparatus having the aforementioned construction.

The objects and other features of the present invention can be more fully understood from the following detailed description when taken in conjunction with the appended drawings, in which.

Figure 1:
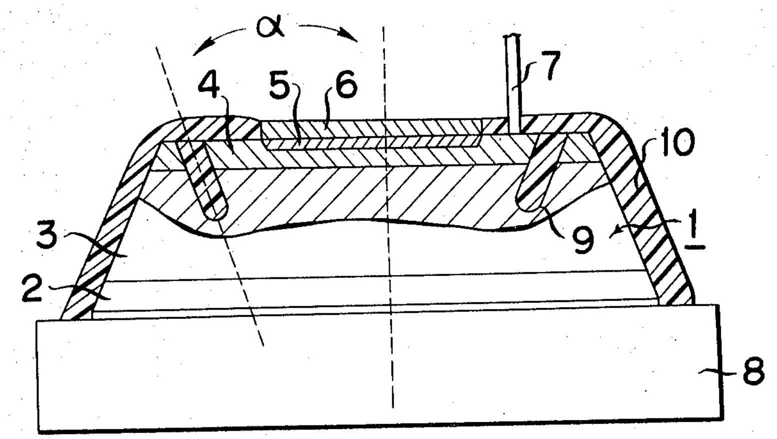
FIG. 1 is a lateral view, with a part broken away, of a silicon controlled rectifier according to an embodiment of the present invention as involved in a semiconductor apparatus.

There will now be described a silicon controlled rectifier according to the present invention by reference to FIGS. 1 to 3.

The semiconductor element 1 made of silicon comprises a layer 2 of P-type conductivity constituting an anode layer, a layer 3 of N-type conductivity, a layer 4 of P-type conductivity constituting a gate layer and a cathode layer 5 of N-type conductivity formed in said layer 4. The lateral peripheral surface of the element is so inclined as to have its diameter gradually reduced toward the top thereof, namely, to have a conical shape. The N-type layer 3 is so prepared as to have higher resistivity than the adjacent layers 2 and 4. Thus the exposed end of the PN junction between the anode layer 2 and N-type layer 3 assumes a positive bevel form and the exposed end of the PN junction between the N-type layer 3 and P-type gate layer 4 has a negative bevel form. To the cathode layer 5 is fitted a cathode electrode 6, to the gate layer 4 a gate electrode 7 and to the anode layer 2 an anode electrode 8. The exposed top surface of the gate layer 4 is provided with a fully continuous annular groove 9 which extends through said gate layer 4 to a prescribed position in the N-type layer 3. The groove 9 is formed slantwise relative to the central axis of the element so as to form a central portion and an end portion in the high resistivity layer 3, which are separated from each other by the groove 9 and to define a prescribed angle α with said axis so that the central portion of the high resistivity layer which is surrounded by the groove is so formed as to have a diameter gradually reduced toward the bottom of the groove. Accordingly, the end of the PN junction between the N-type layer 3 and gate layer 4 which is surrounded by said annular groove is made to have a positive bevel form. It will be apparent that the shape of the groove is not restricted to be annular, but may be, for example, square, rectangular, or of any other form. In this embodiment, the angle α is set at 30°, but may be freely selected between about 60° and about 5°. The reason is that an angle of over 60° presents difficulties in manufacture and an angle of less than 5° will not bring about the later described effect. In the area surrounded by the annular groove 9 are positioned the cathode layer and gate electrode. Further the groove 9 is filled with electrical insulation such as silicone rubber silicone varnish, etc., though it is not always necessary.

There will now be described an example of the method of manufacturing said semiconductor apparatus.

There is first prepared a high resistivity semiconductor substrate of N-type conductivity by doping of phosphorus into the silicon in a concentration of $3\times10^{13}$ atoms/cm.$^3$. In the substrate is diffused gallium in a concentration of $10^{16}$ to $10^{17}$ atoms/cm.$^3$ at a temperature of 1260° C. for 30 hours to form around said substrate a diffused layer of P-type conductivity constituting anode and gate layers. At the top central part of the diffused layer is deposited an Au-SB alloy, which is then treated at a temperature of 700° C. so as concurrently to form at said part an alloy layer of N-type conductivity and a cathode layer, the concentration of said alloy layer being about $10^{18}$ atoms/cm.$^3$. To the top surface of said diffused layer adjacent to the cathode layer is attached an aluminum lead wire by means of ultrasonic waves to form a gate electrode, and to the underside of the diffused layer is bonded a tungsten sheet using aluminum as an adhesive agent so as to form an anode electrode. The lateral periphery of the substrate is grounded with abrasive material to cause it to incline in such a manner that the diameter of the substrate is gradually reduced toward the cathode layer. This grinding may be effected, for example, by forcefully ejecting powders of alumina ($Al_2O_3$) with compressed air onto the surface of the substrate while rotating it at a prescribed velocity. This grinding means is also applicable in the following process of cutting out an annular groove. Namely, the groove can be formed by forcefully ejecting powders of alumina to the surface of the rotating substrate slantwise from the top of the gate layer. It will be apparent that an ultrasonic wave process is also available for this purpose in addition to the above-mentioned means. The groove and substrate surface are coated with silicone varnish or rubber, which is allowed to solidify at normal temperature. Thus is prepared a silicon controlled rectifier.

There will now be described the operation and effect of the semiconductor apparatus of the present invention by reference to FIGS. 2 and 3.

Figure 2:
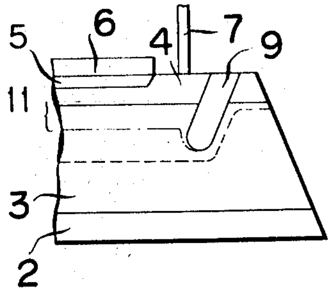
FIG. 2 is a schematic illustration of the condition in which a depletion layer expands when a bias voltage is impressed in one direction on a semiconductor apparatus.
Figure 3:
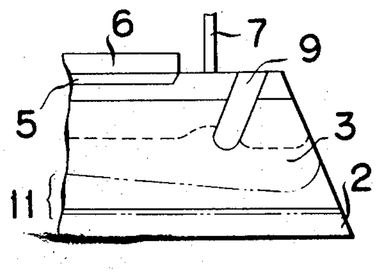
FIG. 3 is a schematic illustration of the condition in which the depletion layer expands when a bias voltage is impressed in the opposite direction in FIG. 2 on a semiconductor apparatus.

With the semiconductor apparatus composed of a PNPN quadruple layer as used in the aforesaid embodiment, when a reverse bias voltage is impressed on the PN junction between the gate layer 4 and N-type layer 3 the resultant depletion layer 11 broadly expands toward said high resistivity N-type layer 3 as shown by the dot-dash line of FIG. 2. Since, in this case, the end of the PN junction exposed in the annular groove 9 assumes the so-called position bevel form, the depletion layer expands more broadly at its end than at its central part. On the other hand, when a reverse bias voltage is impressed on the PN junction between the anode layer 2 and high resisitivity N-type layer 3 the depletion layer 11 widely expands toward the N-type layer 3 as indicated by the two dots-dash line of FIG. 3. The depletion layer expands in such a manner that it becomes wide at the central part immediately below the cathode layer, gets narrower toward the peripheral portion and is again broadened at the peripheral edge.

As mentioned above, even when a reverse bias voltage is impressed on either of the aforesaid two junctions, the depletion layer broadly expands at the exposed end of the junction, so that the breakdown voltage on the surface of the junction is remarkably large. For instance, while a maximum inverse voltage was only 3000 volts with the conventional silicon controlled rectifier, the semiconductor apparatus according to the aforementioned embodiment of the present invention has been proved to have a breakdown voltage of about 6000 to 7000, because when the high resistivity N-type layer 3 has a thickness of 500 microns both junctions have a substantially equal breakdown voltage. Furthermore, the semiconductor apparatus of the present invention allows an appreciably large area for the formation of a cathode layer and cathode electrode with the resultant increased current capacity.

When investigation was made of the magnitude of a breakdown voltage where the depletion layer in the foregoing embodiment expanded beyond the bottom of the groove, it was found that the breakdown voltage was still sufficiently large. The expansions of the depletion layer under such condition are indicated by the broken lines of FIGS. 2 and 3. In the case of FIG. 2, the depletion layer expanded beyond the bottom wall of the groove and further into the high resistivity layer positioned outside of the annular groove. The reason is assumed to be that since the voltage on the junction surface was apportioned to the inner wall of the groove and the outer wall of the high resistivity layer, the breakdown voltage was elevated. In the case of FIG. 3, the breakdown voltage was also raised presumably because the depletion layer more broadly expanded at the sections facing not only the outer wall of the high resistivity layer but also the inner wall of the groove than at the central part of said depletion layer. The aforementioned expansions of the depletion layer in both cases seem to originate with the fact that a limited electric resistance occurred across the inner and outer walls of the annular groove, said resistance causing different potentials in a part of the voltage impressed across the groove walls.

Figure 4:
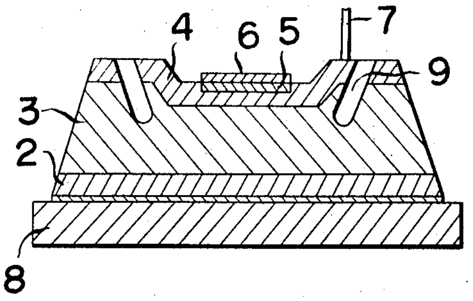
FIG. 4 is a cross-section of a semiconductor apparatus according to another embodiment of the invention.

There will now be described a semiconductor apparatus according to another embodiment of the present invention by reference to FIG. 4. Since this apparatus consists of a silicon controlled rectifier as in the preceding embodiment, the same parts are denoted by the same numerals and description thereof is omitted. The semiconductor element 1 has an inclining lateral peripheral surface and has a depression formed at the upper central part. All over the top surface is formed a gate layer 4, and at the bottom of the depression in the gate layer is disposed a cathode layer 5. Starting with the upper peripheral surface of the element, namely, the raised part of the gate layer 4 is formed a downwardly extending annular groove 9 whose walls inwardly incline toward the central axis of the element, the bottom of said groove being positioned in the high resistivity N-type layer 3. The groove may be filled with silicone rubber or varnish (not shown) as in the preceding embodiment. On the underside of the N-type layer 3 is prepared a P-type anode layer 2, which is fitted to a metal plate 8 constituting an anode electrode. Further, on the cathode layer 5 is mounted a cathode electrode 6 and on the gate layer 4 is provided a gate electrode 7.

The semiconductor apparatus of the present invention has the advantage that since the bottom of the groove is substantially wide apart from the anode layer, the groove causes no obstruction to the depletion layer generated by impressing a reverse bias voltage on the PN junction between the anode layer and high resistivity layer.

Namely, the groove formed according to the present invention is allowed to display its full effect without presenting difficulties in any other part of the semiconductor element.

Figure 5:
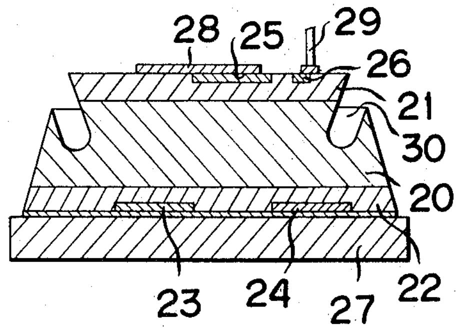
FIG. 5 is a cross-section of a semiconductor apparatus according to still another embodiment of the invention.

The semiconductor apparatus of the present invention is applicable not only to a silicon controlled rectifier, but also to other devices such as a bilateral rectifier and transistor. FIG. 5 represents a bilateral semiconductor controlled rectifier as an example. There will now be described the construction of this rectifier. From the top and bottom surfaces of an N-type silicon substrate 20 is diffused gallium to form P-type diffused layers 21 and 22 on these surfaces respectively. Further in the prescribed positions of the upper and lower gallium layers respectively is diffused phosphorus to form a group of N-type layers 23 and 24 and another group of 25 and 26. Thus is fabricated a semiconductor element. Further there are fitted prescribed electrodes 27, 28 and 29 to the respective groups of layers 22–23–24, 21–25 and 21–26. The prescribed portions of the lateral pheripheral surface of the element are made to incline as illustrated and an annular groove 30 is cut out in the element.

What is claimed is:

1. A semiconductor device comprising a semiconductor element having at least first, second and third layers, the second layer interposed between the other layers and having a higher resistivity than said other layers, adjacent layers being of opposite conductivity type, a first PN-junction being formed between the first and second layers and a second PN-junction being formed between the second and third layers; and a continuous surrounding groove, said groove extending downwards in a slantwise manner from the first layer to the second layer and the bottom of said groove being disposed in the second layer, thereby forming a central portion and an end portion in the second layer which are divided from each other by said groove, the central portion which is surrounded by said groove having a diameter gradually reduced toward the bottom of the groove.

2. A semiconductor device according to claim 1 wherein the semiconductor element comprises, from top to bottom, a cathode layer of N-type conductivity;

a gate layer of low resistivity P-type conductivity;
a high resistivity layer of N-type conductivity; and
an anode layer of low resistivity P-type conductivity;
the groove being formed slantwise downward from the upper surface of the gate layer.

3. A semiconductor device according to claim 1 wherein said continuous surrounding groove is annular in form.

4. A semiconductor device according to claim 3 wherein the annular groove is filled with an electrical insulator.

5. A semiconductor device according to claim 4 wherein the electrical insulator is silicone rubber.

6. A semiconductor device according to claim 1 wherein the groove of the semiconductor element extends inwardly from the peripheral surface of the first layer to the interior of the second layer.

7. A semiconductor device according to claim 1 wherein the peripheral surface of the seimconductor element inclines so that the diameter of said element is gradually broadened toward the bottom thereof.

8. A semiconductor device according to claim 2 wherein the upper central part of the semiconductor element has depression formed therein and said cathode layer is formed in said depression.

References Cited

UNITED STATES PATENTS

| | | | |
|---|---|---|---|
| 2,980,860 | 4/1961 | Macdonald | 330—6 |
| 3,354,004 | 11/1967 | Reisman et al. | 148—175 |
| 3,378,688 | 4/1968 | Kabell | 250—211 |
| 3,354,003 | 11/1967 | Langridge et al. | 317—235 |
| 3,370,209 | 2/1968 | Davis et al. | 317—235 |
| 3,423,649 | 1/1969 | Herlet | 317—235 |

FOREIGN PATENTS

| | | | |
|---|---|---|---|
| 1,052,661 | 12/1966 | Great Britain | 317—235 |

JERRY D. CRAIG, Primary Examiner